(12) United States Patent
Chepulskyy et al.

(10) Patent No.: US 9,082,534 B2
(45) Date of Patent: Jul. 14, 2015

(54) MAGNETIC ELEMENT HAVING PERPENDICULAR ANISOTROPY WITH ENHANCED EFFICIENCY

(71) Applicants: Roman Chepulskyy, Milpitas, CA (US); Dmytro Apalkov, San Jose, CA (US)

(72) Inventors: Roman Chepulskyy, Milpitas, CA (US); Dmytro Apalkov, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 92 days.

(21) Appl. No.: 13/779,734

(22) Filed: Feb. 27, 2013

(65) Prior Publication Data

US 2013/0177781 A1 Jul. 11, 2013

Related U.S. Application Data

(63) Continuation-in-part of application No. 13/311,308, filed on Dec. 5, 2011, now Pat. No. 8,456,898, which is a continuation of application No. 12/560,362, filed on Sep. 15, 2009, now Pat. No. 8,072,800.

(51) Int. Cl.
| | |
|---|---|
| *H01F 1/147* | (2006.01) |
| *H01F 10/32* | (2006.01) |
| *G11C 11/15* | (2006.01) |
| *H01F 1/01* | (2006.01) |
| *G01R 33/09* | (2006.01) |
| *B82Y 25/00* | (2011.01) |
| *G11C 11/16* | (2006.01) |
| *H01L 43/08* | (2006.01) |
| *H01L 43/10* | (2006.01) |
| *H01L 27/22* | (2006.01) |

(52) U.S. Cl.
CPC . *H01F 1/01* (2013.01); *B82Y 25/00* (2013.01); *G01R 33/091* (2013.01); *G01R 33/098* (2013.01); *G11C 11/16* (2013.01); *G11C 11/161* (2013.01); *H01F 10/3254* (2013.01); *H01F 10/3259* (2013.01); *H01F 10/3268* (2013.01); *H01F 10/3286* (2013.01); *H01L 43/08* (2013.01); *H01L 43/10* (2013.01); *H01L 27/228* (2013.01); *Y10T 428/115* (2015.01); *Y10T 428/1114* (2015.01)

(58) Field of Classification Search
None
See application file for complete search history.

(56) References Cited

U.S. PATENT DOCUMENTS

| | | | | |
|---|---|---|---|---|
| 5,656,381 | A * | 8/1997 | Maeda et al. | 428/611 |
| 8,072,800 | B2 * | 12/2011 | Chen et al. | 365/158 |
| 8,456,898 | B2 * | 6/2013 | Chen et al. | 365/158 |
| 8,623,452 | B2 * | 1/2014 | Zhou | 427/129 |
| 8,758,850 | B2 * | 6/2014 | Zhou et al. | 427/130 |
| 2009/0257151 | A1 * | 10/2009 | Zhang et al. | 360/324.2 |
| 2009/0323228 | A1 * | 12/2009 | Carey et al. | 360/319 |

(Continued)

*Primary Examiner* — Kevin Bernatz
(74) *Attorney, Agent, or Firm* — Renaissance IP Law Group LLP

(57) ABSTRACT

A material composition for forming a free layer in a STT structure (such as a single or dual MTJ structure) can include $Co_xFe_yM_z$, where M is a non-magnetic material that assists in forming a good crystalline orientation and matching between the free layer and an MgO interface. The material M preferably either does not segregate to the MgO interface or, if it does segregate to the MgO interface, it does not significantly reduce the PMA of the free layer. The free layer can further include a connecting layer, where M is attracted to the insertion layer during annealing. The free layer can include a graded composition of $Co_xFe_yM_z$, where z changes within the free layer.

22 Claims, 13 Drawing Sheets

(56) References Cited

U.S. PATENT DOCUMENTS

| | | |
|---|---|---|
| 2011/0026168 A1* | 2/2011 | Carey et al. .............. 360/324.11 |
| 2011/0043950 A1* | 2/2011 | Carey et al. .................. 360/320 |
| 2011/0318848 A1* | 12/2011 | Choi et al. ........................ 438/3 |
| 2013/0064971 A1* | 3/2013 | Carey et al. .................... 427/123 |
| 2013/0270661 A1* | 10/2013 | Yi et al. ........................ 257/421 |
| 2014/0175581 A1* | 6/2014 | Guo .............................. 257/421 |
| 2014/0248719 A1* | 9/2014 | Zhou et al. ........................ 438/3 |

* cited by examiner

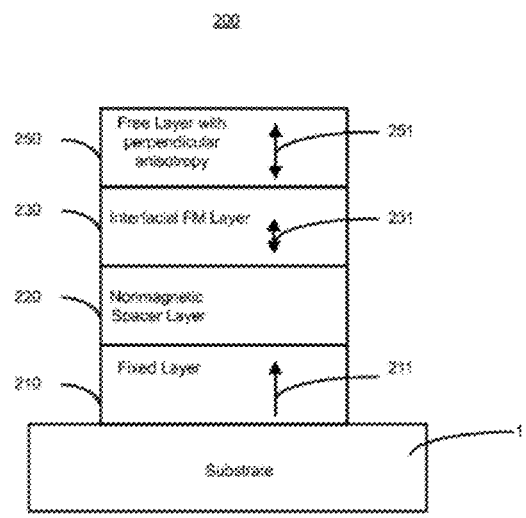

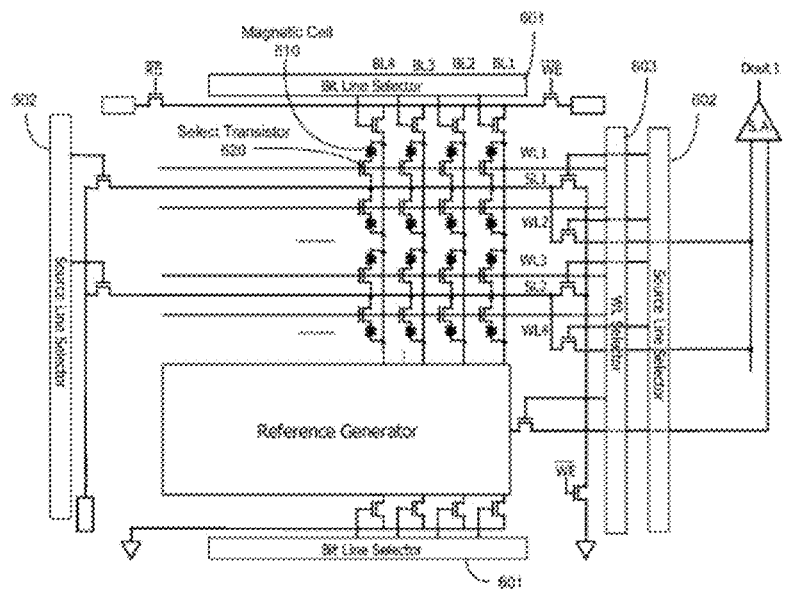
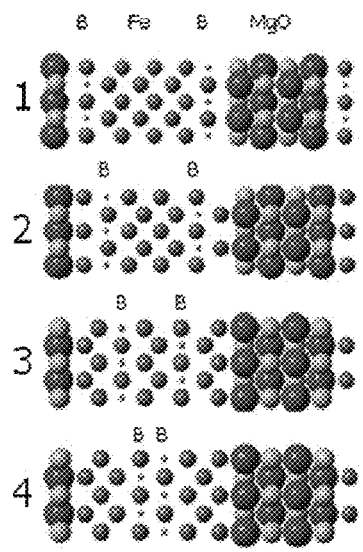
FIG. 8

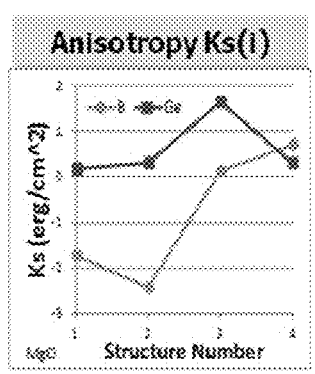 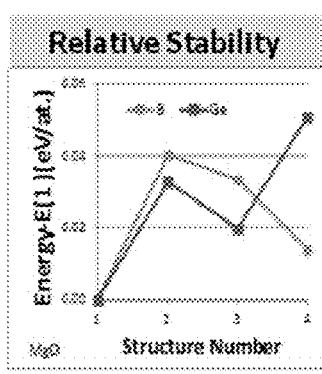 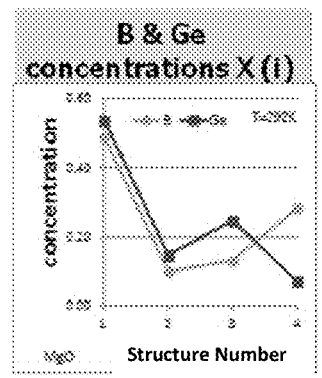
FIG. 11a  FIG. 11b  FIG. 11c
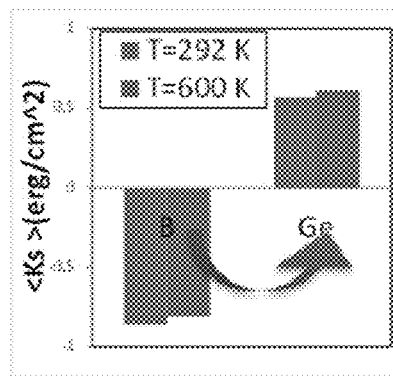
FIG. 12

MAGNETIC ELEMENT HAVING PERPENDICULAR ANISOTROPY WITH ENHANCED EFFICIENCY

CROSS-REFERENCE TO RELATED APPLICATIONS

This application is a continuation-in-part of, and claims priority under 35 U.S.C. §120 to, U.S. patent application Ser. No. 13/311,308, filed Dec. 5, 2011, which is a continuation of, and claims priority from, U.S. patent application Ser. No. 12/560,362, filed on Sep. 15, 2009, the contents of each of which are incorporated herein by reference in their entireties.

BACKGROUND

This document relates to magnetic materials and structures having at least one free ferromagnetic layer.

Various magnetic materials use multilayer structures which have at least one ferromagnetic layer configured as a "free" layer whose magnetic direction can be changed by an external magnetic field or a control current. Magnetic memory devices may be constructed using such multilayer structures where information is stored based on the magnetic direction of the free layer.

One example for such a multilayer structure is a spin valve (SV) which includes at least three layers: two ferromagnetic layers and a conducting layer between the two ferromagnetic layers. Another example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. However, when the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer.

Notably, the resistance to the electrical current across the MTJ or SV structures varies with the relative direction of the magnetizations in the two ferromagnetic layers. When the magnetizations of the two ferromagnetic layers are parallel to each other, the resistance across the MTJ or SV structures is at a minimum value RP. When the magnetizations of the two ferromagnetic layers are anti-parallel with each other, the resistance across the MTJ or SV is at a maximum value RAP. The magnitude of this effect is commonly characterized by the tunneling magnetoresistance (TMR) in MTJs or magnetoresistance (MR) in SVs defined as $(R_{AP}-R_P)/R_P$.

SUMMARY

This document discloses techniques, devices and systems that use magnetic elements that include at least a fixed magnetic layer having perpendicular anisotropy, a nonmagnetic spacer layer, and a free magnetic layer having perpendicular anisotropy which promotes magnetization substantially perpendicular to the plane of the magnetic layers. The spacer layer resides between the fixed and free layers. The magnetic element is configured to allow the free layer to be switched using spin transfer when a write current is passed through the magnetic element.

In one aspect, methods and structures are disclosed to provide perpendicular anisotropy in a multilayer magnetic element. In one implementation, a fixed layer is provided to have a magnetization fixed in a direction substantially perpendicular to the fixed layer, a nonmagnetic spacer layer is provided over the fixed layer, and a free layer is located relative to the fixed layer and the spacer layer so that the spacer layer is between the free and fixed layer. The free layer has a free layer magnetization that is substantially perpendicular to the free layer and is changeable relative to the fixed layer magnetization. An interfacial layer is in contact with the spacer layer and is a magnetic layer. A connecting layer is in contact with the interfacial layer and the free layer. The connecting layer has a structure providing magnetic coupling between the free layer and the interfacial layer that maintains the magnetization of the interfacial layer to be substantially perpendicular to the interfacial layer and providing a separation between the free layer and the interfacial layer to permit the free layer and the interfacial layer to have different material structures.

The free layer and/or the fixed layer are configured to have perpendicular anisotropy. In certain implementations, the free layer and/or the fixed layer could include ferromagnetic $(Ni, Fe, Co)_{100-y}(Pd, Pt)_y$ where y ranges between twenty and eighty atomic percent, or between fifty and seventy five atomic percent.

In certain implementations, the free layer and/or the fixed layer having perpendicular anisotropy could include ferromagnetic material $(Ni, Fe, Co)_{50}(Pd, Pt)_{50}$ combined with nonmagnetic material(s). In certain implementations the nonmagnetic material(s) could include at least one of Ti, Zr, Hf, V, Nb, Ta, Cr, Mo, W, Pt, Pd, Ir, Rh, Ru, Os, Re, Au, Ag, Cu. In certain implementations the nonmagnetic material(s) could include at least one of B, C, N, O, Al, Si, P, S, Ga, Ge, In, Sn, an oxide, a nitride, or a transition metal. In certain implementations the nonmagnetic material(s) could include at least one Ti, Zr, Hf, V, Nb, Ta, Cr, Mo, W, Pt, Pd, Ir, Rh, Ru, Os, Re, Au, Ag, Cu and at least one of B, C, N, O, Al, Si, P, S, Ga, Ge, In, Sn, an oxide, a nitride, or a transition metal silicide.

In certain implementations, the free layer and/or the fixed layer having perpendicular anisotropy could include ferromagnetic material Ni, Fe, or an alloy of Ni, Fe, and/or Co including at least Ni and/or Fe combined with nonmagnetic material(s). In certain implementations the nonmagnetic material(s) could include at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide.

In certain implementations, the free layer and/or the fixed layer having perpendicular anisotropy could include ferromagnetic material (Ni, Fe, Co) combined with nonmagnetic material(s). In certain implementations the nonmagnetic material(s) could include at least one of Cr, Ta, Nb, V, W, Hf, Ti, Zr, Pt, Pd, Gd, Tb, Dy, Ho, Nd, and at least one of Ti, Zr, Hf, V, Nb, Ta, Cr, Mo, W, Pt, Pd, Ir, Rh, Ru, Os, Re, Au, Ag, Cu. In certain implementations the nonmagnetic material(s) could include at least one of Cr, Ta, Nb, V, W, Hf, Ti, Zr, Pt, Pd, Gd, Tb, Dy, Ho, Nd, and at least one of B, C, N, O, Al, Si, P, S, Ga, Ge, In, Sn, an oxide, a nitride, or a transition metal silicide.

In certain implementations, the free layer and/or the fixed layer having perpendicular anisotropy could include material Mn, and/or including at least Ni, Al, Cr, and/or Fe combined with nonmagnetic material(s). In certain implementations the nonmagnetic material(s) could include at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide.

In certain implementations, the free layer and/or the fixed layer having perpendicular anisotropy could include a multilayer including alternating layers of magnetic material layers and nonmagnetic material layers. In certain implementations the magnetic material layers includes (Ni, Fe, Co) and the nonmagnetic material layers include at least one of Ti, Zr, Hf, V, Nb, Ta, Cr, Mo, W, Pt, Pd, Ir, Rh, Ru, Os, Re, Au, Ag, Cu. In certain implementations the magnetic material layers includes (Ni, Fe, Co) and the nonmagnetic material layers include at least one of B, C, N, O, Al, Si, P, S, Ga, Ge, In, Sn, an oxide, a nitride, or a transition metal silicide. In certain implementations the magnetic material layers includes (Ni, Fe, Co)$_{50}$(Pd, Pt)$_{50}$ and the nonmagnetic material layers include at least one of Cr, Pt, Pt, Pd, Ir, Rh, Ru, Os, Re, Au, Cu. In certain implementations the magnetic material layers includes (Ni, Fe, Co) combined with at least one of Cr, Pt, Pd, Ir, Rh, Ru, Os, Re, Au, Cu. In certain implementations the magnetic material layers includes (Ni, Fe, Co) combined with at least one of Cr, Ta, Nb, V, W, Hf, Ti, Zr, Pt, Pd and the nonmagnetic material layers include at least one of Cr, Pt, Pt, Pd, Ir, Rh, Ru, Os, Re, Au, Cu. In certain implementations the magnetic material layers includes (Ni, Fe, Co) combined with at least one of B, C, N, O, Al, Si, P, S, Ga, Ge, In, Sn and the nonmagnetic material layers include at least one of Cr, Pt, Pt, Pd, Ir, Rh, Ru, Os, Re, Au, Cu. In certain implementations the magnetic material layers includes (Ni, Fe, Co) combined with at least one of Cr, Ta, Nb, V, W, Hf, Ti, Zr, Pt, Pd and the nonmagnetic material layers include at least one of B, C, N, O, Al, Si, P, S, Ga, Ge, In, Sn, an oxide, a nitride, or a transition metal silicide.

In another aspect, a device is provided to include a magnetic element array including a substrate and magnetic elements formed on the substrate. Each magnetic element includes a fixed layer having a fixed layer magnetization fixed in a direction substantially perpendicular to the fixed layer, a nonmagnetic spacer layer over the fixed layer, an interfacial layer in contact with the spacer layer and being a magnetic layer, a connecting layer in contact with the interfacial layer, and a free layer in contact with the connecting layer and having a free layer magnetization that is substantially perpendicular to the free layer and is changeable relative to the fixed layer magnetization based on spin torque transfer. The connecting layer has a structure providing magnetic coupling between the free layer and the interfacial layer that maintains the magnetization of the interfacial layer to be substantially perpendicular to the interfacial layer and providing a separation between the free layer and the interfacial layer to permit the free layer and the interfacial layer to have different material structures. This device includes a circuit that is coupled to the magnetic element array and supplies a current to flow through layers of each magnetic element in a direction substantially perpendicular to the layers to switch the magnetization of the free layer based on spin torque transfer between two magnetization directions.

Although the drawings may, in some instances, show distinct magnetizations for interfacial layers arranged adjacent to magnetic layers, it should be noted that when there is an interfacial layer adjacent to a magnetic layer, the two may be strongly coupled and behave as a single switching element. In addition, when a magnetic layer (either fixed or free) is implemented with an interfacial layer, that interfacial layer may effectively become part of the fixed or free layer it is adjacent to, and can therefore be thought of as a two-part free or fixed layer (e.g., "free layer part A+free layer part B" or "fixed layer part A+fixed layer part B") as opposed to a free/fixed layer plus a separate interfacial layer.

These and other implementations are described in greater detail in the drawings, the description and the claims.

BRIEF DESCRIPTION OF THE DRAWINGS

FIGS. 3A, 3B and 3C show examples of magnetic elements having a perpendicular anisotropy based on one or more interfacial layers.

FIG. 7 depicts an exemplary implementation of the device in FIG. 6 illustrating a circuit that operates the device based on spin-transfer torque switching with a perpendicular anisotropy free layer and/or fixed layer.

FIG. 8 is a schematic diagram illustrating the atomic structure of a free layer comprising iron (Fe) and Boron (B), according to four different configurations in which the Boron is arranged at different locations within the free layer.

FIGS. 11a, 11b, and 11c are graphs respectively comparing the anisotropy, relative stability, and B and Ge concentrations of the structures shown in FIG. 10.

FIG. 12 is a graph comparing the anisotropy of free layers including interstitial B and Ge at two different temperatures.

DETAILED DESCRIPTION

Multilayered magnetic elements with a free layer and a fixed layer separated by a nonmagnetic spacer, when grown monolithically on a substrate, require certain material properties of adjacent layers to be compatible or match, e.g., match of lattice structures. This can limit the choice of materials suitable for forming such structures and thus affect the properties of the constructed magnetic elements. Examples of multilayered magnetic elements described in this document have a magnetization substantially perpendicular to the free and fixed layers. Free layer and fixed (reference) layers can be comprised of several ferromagnetic layers to increase the TMR ratio, achieve a high STT efficiency and reduce the damping constant.

The following sections first describe structures of magnetic elements and then provide examples of magnetic elements with a substantially perpendicular magnetization and the additional layers for engineering the magnetic elements.

Figure 1A:
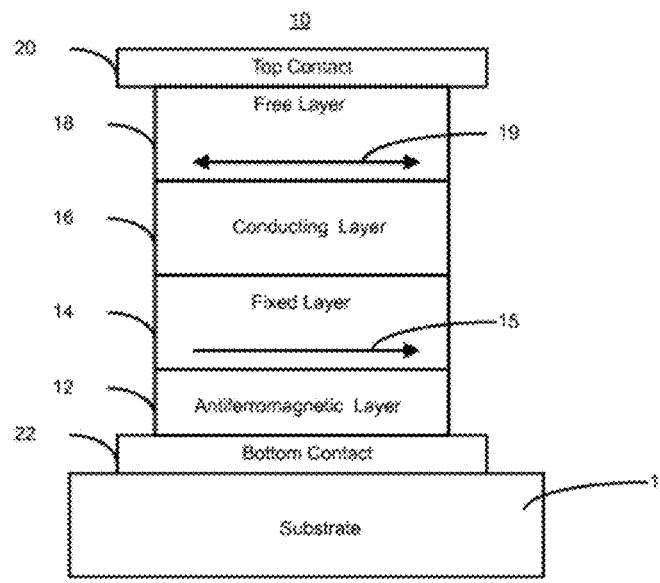
FIG. 1A shows an example of a magnetic element in the form a spin valve.
Figure 1B:
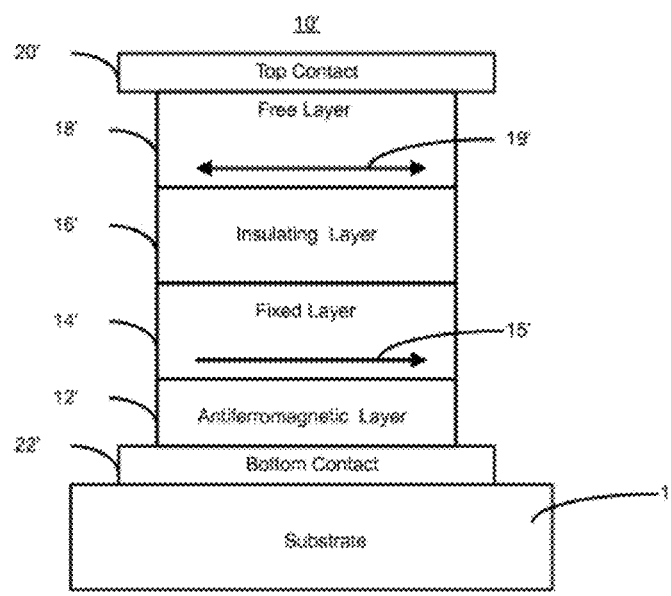
FIG. 1B shows an example of a magnetic element in the form of a spin tunneling junction.

FIGS. 1A and 1B depict exemplary magnetic elements 10 and 10' formed on a substrate 1. The magnetic element 10 is a spin valve and includes an antiferromagnetic (AFM) layer 12, a fixed layer 14, a conductive spacer layer 16 and a free layer 18. Other layers, such as seed or capping layer can also be used. The fixed layer 14 and the free layer 18 are ferromagnetic. The free layer 18 is depicted as having a changeable magnetization 19. The magnetization of the free layer 18 is free to rotate, in response to an external magnetic field, a driving electric current, or a combination of both. The conductive spacer layer 16 is nonmagnetic. The AFM layer 12 is used to pin the magnetization of the fixed layer 14 in a particular direction. After post annealing, the ferromagnetic layer 14 is pinned with a fixed magnetization 15. Also depicted are top contact 20 and bottom contact 22 that can be used to drive current through the magnetic element 10.

The magnetic element 10' depicted in FIG. 1B is a magnetic tunneling junction. The magnetic element 10' includes an AFM layer 12', a fixed layer 14' having a fixed layer magnetization 15', an insulating barrier layer 16', a free layer 18' having a changeable magnetization 19'. The barrier layer 16' is thin enough for electrons to tunnel through in a magnetic tunneling junction 10'.

The relationship between the resistance to the current flowing across the MTJ or SV and the relative magnetic direction between the two ferromagnetic layers in the TMR or MR effect can be used for nonvolatile magnetic memory devices to store information in the magnetic state of the magnetic element. Magnetic random access memory (MRAM) devices based on the TMR or MR effect, for example, can be an alternative of and compete with electronic RAM devices. In such devices, one ferromagnetic layer is configured to have a fixed magnetic direction and the other ferromagnetic layer is a "free" layer whose magnetic direction can be changed to be either parallel or opposite to the fixed direction and thus operate as a recording layer. Information is stored based on the relative magnetic direction of the two ferromagnetic layers on two sides of the barrier of the MTJ or SV. For example, binary bits "1" and "0" can be recorded as the parallel and anti-parallel orientations of the two ferromagnetic layers in the MTJ or SV. Recording or writing a bit in the MTJ or SV can be achieved by switching the magnetization direction of the free layer, e.g., by a writing magnetic field generated by supplying currents to write lines disposed in a cross stripe shape, by a current flowing across the MTJ or SV based on the spin transfer effect, by a combination of applying both a writing magnetic field and a current, or by other means.

Magnetic random access memory devices utilizing a spin transfer effect in switching can be operated under a low switching current density, $J_c$, below $10^7$ A/cm$^2$ (e.g., around or below $10^6$ A/cm$^2$) for practical device applications. This low switching current density advantageously allows for formation of densely packed memory cells (e.g., sub-micron lateral dimensions) with a high bias current. The reduction of spin-transfer switching current density $J_c$ can be critical for making MRAM devices featured by a fast operation speed, low power consumption, and a high spatial density of memory cells. With decreased technology node of memory devices, however, thermal stability decreases and increasingly affects the performance of these devices. During periods of latency when an MTJ preserves a stored datum, the magnetization in the free layer is not entirely static and may change due to thermal fluctuations that allow the magnetic moments within the free layer to oscillate or precess. The random nature of these fluctuations allows the occurrence of rare, unusually large fluctuations that may result in the reversal of the free-layer magnetization.

Magnetic materials with perpendicular anisotropy can be used to provide increased thermal stability in magnetic devices, including spin transfer magnetic devices. In these devices, the thermal activation factor depends on the volume and perpendicular magnetic anisotropy of the free layer of a magnetic element and the thermal stability decreases as the volume of the magnetic element reduces. The large perpendicular anisotropy can compensate for the reduced thermal stability due to the decrease in volume associated with the decreasing device size. In addition, for spin transfer devices utilizing perpendicular anisotropy, the in-plane shape anisotropy is no longer required in the device design. Accordingly, the device shape can be circular instead of an elongated shape to improve the memory device areal density.

Based on a spin transfer model, the switching current density can be expressed for the films having out-of-plane or perpendicular dominant anisotropy in the absence of external field as:

$$J_c \text{ varies } \alpha M_s t(H\perp - 4\pi Ms)/\eta$$

where $\alpha$ is the phenomenological Gilbert damping, t and $M_s$ are the thickness and saturation magnetization of the free layer, respectively. $H\perp$ is intrinsic perpendicular uniaxial anisotropy field which could be resulted from interfacial (or surface) anisotropy and/or effect of magneto-elastic energy. $\eta$ corresponds to an efficiency of spin transfer switching. $4\pi Ms$ comes from demagnetization field substantially perpendicular to the film plane.

The absolute value of $H\perp$ is generally larger than that of $4\pi Ms$ for the case of the film having out-of-plane perpendicular anisotropy. Therefore, the term of $(H\perp - 4\pi Ms)$ and the associated switching current density Jc, can be reduced through optimization of $H\perp$ of the free layer in the case of the films having perpendicular anisotropy. In addition, a reduction of magnetization Ms of the free layer can be used to reduce the switching current density Jc.

Magnetic devices based on a magnetic element having substantially perpendicular magnetization layers can be switched using the spin transfer effect. The small spin-transfer switching current and high read signal can be achieved by using the substantially perpendicular magnetization in spin valve and magnetic tunnel junction films.

Figure 2A:
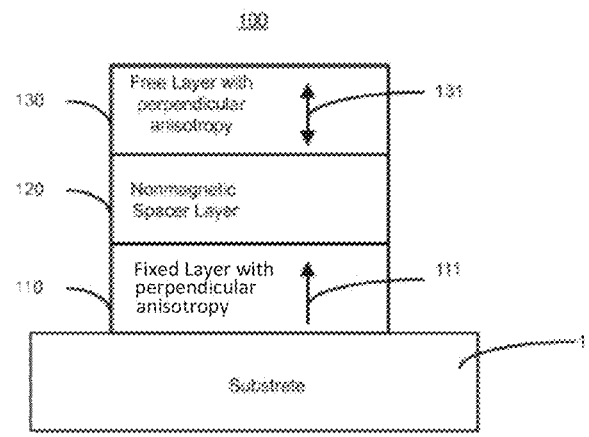
FIGS. 2A and 2B depict examples of two magnetic elements having perpendicular anisotropy with fixed layer below and above the nonmagnetic spacer.

FIG. 2A depicts one implementation of a magnetic element 100 on a substrate 1. This magnetic element 100 includes a free layer 130 on the top and a fixed layer 110 on the bottom, both with perpendicular anisotropy. A nonmagnetic spacer layer 120 is formed between the layers 110 and 130. The fixed layer 110 has a fixed layer magnetization 111 substantially perpendicular to the fixed layer 110, and the free layer 130 has a reversible free layer magnetization 131 substantially perpendicular to the free layer 130. The free layer magnetization 131 can be written using the spin transfer effect. In this example, the fixed layer 110 is under nonmagnetic spacer layer 120 and above the substrate 1 and the free layer 130 is above the nonmagnetic spacer layer 120. Fixed layer 110 and/or free layer 130 can include magnetic materials multilayered with nonmagnetic or oxide layers, in which the magnetic sublayers can be antiferro-magnetically or ferro-magnetically coupled. Nonmagnetic spacer layer 120 can include insulating layers such as $Al_2O_3$, MgO, TiO, TaO, and other oxides. Nonmagnetic spacer layer 120 can include conducting layers such as Cu. An antiferromagnetic layer can be included to pin the magnetization of the fixed layer magnetization 111 in a desired direction after post annealing.

Figure 2B:
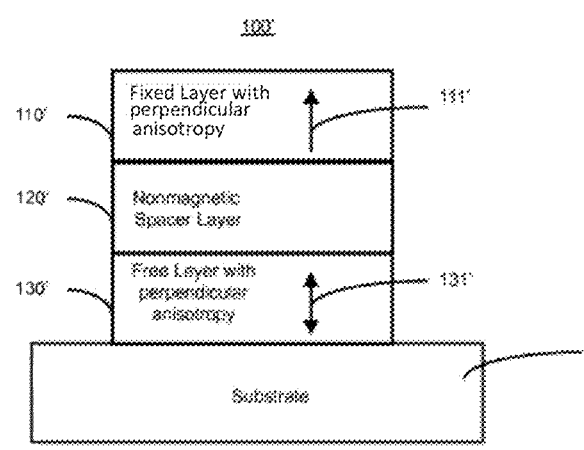

FIG. 2B depicts another implementation of a magnetic element 100' on a substrate 1 having a free layer and a fixed layer, both with perpendicular anisotropy. The magnetic element 100' includes a fixed layer 110' having a fixed layer magnetization 111', a nonmagnetic spacer layer 120', and a free layer 130' with magnetization 131' that can be written using spin transfer. The fixed layer 110' is above nonmagnetic spacer layer 120' and the free layer 130' is under the nonmagnetic spacer layer 120' and above the substrate 1. Fixed layer 110' and/or free layer 130' can include magnetic materials multilayered with nonmagnetic or oxide layers, in which the magnetic sublayers can be antiferro-magnetically or ferro-magnetically coupled. Nonmagnetic spacer layer 120 can include insulating layers such as $Al_2O_3$, MgO, TiO, TaO, and other oxides. Nonmagnetic spacer layer 120' can include conducting layers such as Cu. An antiferromagnetic layer can be included to pin the magnetization of the fixed layer magnetization 111 in a desired direction after post annealing.

A capping layer can be included above free layer 130 in FIG. 2A and the fixed layer 110' in FIG. 2B. Also, a seed layer can be included between the fixed layer 110 and the substrate 1 in FIG. 2A and between the free layer 130' and the substrate 1 in FIG. 2B. Both the capping layer and seed layer can be a single layer or multilayer in structure, crystalline or amorphous in state, metal or oxide, magnetic or non-magnetic, either with in-plane or with perpendicular anisotropy. The capping layer and/or seed layer can be at least one of Ti, Zr, Hf, V, Nb, Ta, Cr, Mo, W, Pt, Pd, Ir, Rh, Ru, Os, Re, Au, Ag, Cu; or B, C, N, O, Al, Si, P, S or their alloying, or oxide, nitride or silicide with transition metal, such as AlMg, CrTi, CrMo, CrRu, NiAl, NiP, NiFeCr, MgO, TaO, TiO, AlO, SiO, CuAlO, TiN, TaN, CuN, FeSi, CoO, NiO. The capping layer and/or seed layer can improve texture for perpendicular properties, improve interfacial properties for stack growth and tunneling magnetoresistance, act as a stop layer for interdiffusion, provide protection cover or coating for stack stability, and/or shield the magnetic layers from stray magnetic fields.

In FIG. 2A, to obtain the free layer 130 and/or the fixed layer 110 with perpendicular anisotropy, a ferromagnetic material and a nonmagnetic material can be combined in a single ferromagnetic layer used in or for the free layer 130 and/or the fixed layer 110. Thus, the free layer 130 and/or the fixed layer 110 with perpendicular anisotropy can be made by combining ferromagnetic and nonmagnetic materials. Further, free layer 130 and/or the fixed layer 110 with perpendicular anisotropy can be provided by providing a free layer that includes a multilayer of magnetic and nonmagnetic layers.

In FIG. 2B, the magnetic layer with perpendicular anisotropy can be implemented by providing a free layer and/or a fixed layer that includes a ferromagnetic material and nonmagnetic material. To obtain the free layer 130' and/or the fixed layer 110' with perpendicular anisotropy, a ferromagnetic material and a nonmagnetic material can be combined in a single ferromagnetic layer used in or for the free layer 130' and/or the fixed layer 110'. Thus, the free layer 130' and/or the fixed layer 110' with perpendicular anisotropy can be made by combining ferromagnetic and nonmagnetic materials. Further, free layer 130' and/or the fixed layer 110' with perpendicular anisotropy can be provided by providing a free layer that includes a multilayer of magnetic and nonmagnetic layers.

In one implementation, a free layer 130 and/or the fixed layer 110 with perpendicular anisotropy can be provided with ferromagnetic material $(Ni, Fe, Co)_{100-y}(Pd, Pt)_y$ where y ranges between twenty and eighty atomic percent, or between fifty and seventy five atomic percent. Here, (Ni, Fe, Co) denotes Ni, Fe, Co, or an alloy of Ni, Fe, and/or Co. Likewise, (Pd, Pt) denotes Pd, Pt or an alloy of Pd and Pt. For example, in this implementation, free layer 130 and/or the fixed layer 110 can be comprised of $Co_{50}Pt_{50}$ or $Co_{50}Pd_{50}$. Free layer 130 and/or fixed layer 110 can include magnetic materials multilayered with nonmagnetic or oxide layers, in which the magnetic sublayers can be antiferro-magnetically or ferro-magnetically coupled.

In a second implementation, a free layer 130 and/or the fixed layer 110 with perpendicular anisotropy can be provided by combining ferromagnetic material $(Ni, Fe, Co)_{50}(Pd, Pt)_{50}$ with material X, where X includes at least one of Ti, Zr, Hf, V, Nb, Ta, Cr, Mo, W, Pt, Pd, Ir, Rh, Ru, Os, Re, Au, Ag, Cu. In one implementation, X ranges between zero and fifty atomic percent in content. For example, in this implementation, free layer 130 can be comprised of $CO_{45}Pd_{55}$, $CO_{45}Pd_{45}Cu_{10}$, $CO_{45}Pd_{45}Re_{10}$. Free layer 130 and/or fixed layer 110 can include magnetic materials multilayered with nonmagnetic or oxide layers, in which the magnetic sublayers can be antiferro-magnetically or ferro-magnetically coupled.

In a third implementation, a free layer 130 and/or the fixed layer 110 with perpendicular anisotropy can be provided by combining ferromagnetic material $(Ni, Fe, Co)_{50}(Pd, Pt)_{50}$ with material X, where X includes at least one of B, C, N, O, Al, Si, P, S, Ga, Ge, In, Sn, an oxide, a nitride, or a transition metal. In one implementation, X ranges between zero and fifty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a fourth implementation, a free layer 130 and/or the fixed layer 110 with perpendicular anisotropy can be provided by combining ferromagnetic material Ni, Fe, or an alloy of Ni, Fe, and/or Co including at least Ni and/or Fe with material X, where X includes at least one of Ti, Zr, Hf, V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide. In one implementation, X ranges between zero and eighty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a fifth implementation, a free layer 130 and/or the fixed layer 110 with perpendicular anisotropy can be provided by combining ferromagnetic material $(Ni, Fe, Co)_{50}(Pd, Pt)_{50}$ with materials X and Y; where X includes Ti, Zr, Hf, V, Nb, Ta, Cr, Mo, W, Pt, Pd, Ir, Rh, Ru, Os, Re, Au, Ag, Cu; and where Y includes at least one of B, C, N, O, Al, Si, P, S, Ga, Ge, In, Sn, an oxide, a nitride, or a transition metal silicide. In one implementation, X ranges between zero and fifty atomic percent in content. In one implementation, Y ranges between zero and fifty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In a sixth implementation, a free layer 130 and/or the fixed layer 110 with perpendicular anisotropy can be provided by (Ni, Fe, Co) with materials X and Y; where X includes Cr, Ta, Nb, V, W, Hf, Ti, Zr, Pt, Pd, Gd, Tb, Dy, Ho, Nd; and where Y includes Ti, Zr, Hf; V, Nb, Ta, Cr, Mo, W, Pt, Pd, Ir, Rh, Ru, Os, Re, Au, Ag, Cu. In one implementation, X and/or Y ranges between zero and eighty atomic percent in content. Free layer 130 and/or fixed layer 110 can include magnetic materials multilayered with nonmagnetic or oxide layers, in which the magnetic sublayers can be antiferro-magnetically or ferromagnetically coupled.

In a seventh implementation, a free layer 130 and/or the fixed layer 110 with perpendicular anisotropy can be provided by (Ni, Fe, Co) with materials X and Y; where X includes Cr, Ta, Nb, V, W, Hf, Ti, Zr, Pt, Pd, Gd, Tb, Dy, Ho; and where Y includes at least one of B, C, N, O, Al, Si, P, S, Ga, Ge, In, Sn, an oxide, a nitride, or a transition metal silicide. In one implementation, X and/or Y ranges between zero and eighty atomic percent in content. Free layer 130 and/or fixed layer 110 can include magnetic materials multilayered with nonmagnetic or oxide layers, in which the magnetic sublayers can be antiferro-magnetically or ferro-magnetically coupled.

In an eighth implementation, a free layer 130 and/or the fixed layer 110 with perpendicular anisotropy can be provided by a multilayer comprised of alternating layers of magnetic material and material Y, where the layers of magnetic material include (Ni, Fe, Co) and Y includes Ni, Fe, Co, Ti, Zr, Hf, V, Nb, Ta, Cr, Mo, W, Pt, Pd, Ir, Rh, Ru, Os, Re, Au, Ag, Cu. Y can be thinner, equal, or thicker than the magnetic layers in thickness.

In a ninth implementation, a free layer 130 and/or the fixed layer 110 with perpendicular anisotropy can be provided by a multilayer comprised of alternating layers of magnetic material and material Y, where the layers of magnetic material include (Ni, Fe, Co) and Y includes at least one of Ni, Fe, Co, B, C, N, O, Al, Si, P, S, Ga, Ge, In, Sn, an oxide, a nitride, or a transition metal silicide. Y can be thinner, equal, or thicker than the magnetic layers in thickness.

In a tenth implementation, a free layer 130 and/or the fixed layer 110 with perpendicular anisotropy can be provided by a multilayer comprising of alternating layers of magnetic material and nonmagnetic material, where magnetic material layers include ferromagnetic material (Ni, Fe, Co)$_{50}$(Pd, Pt)$_{50}$ and nonmagnetic material layers include material X where X includes Cr, Pt, Pt, Pd, Ir, Rh, Ru, Os, Re, Au, Cu. The nonmagnetic material layers can be thinner, equal, or thicker than the magnetic layers in thickness.

In an eleventh implementation, a free layer 130 and/or the fixed layer 110 with perpendicular anisotropy can be provided by a multilayer comprising of alternating layers of magnetic material and nonmagnetic material, where magnetic material layers are provided by combining ferromagnetic material (Ni, Fe, Co) with material X where X includes Cr, Pt, Pd, Ir, Rh, Ru, Os, Re, Au, Cu. The nonmagnetic material layers can be thinner, equal, or thicker than the magnetic layers in thickness.

In a twelfth implementation, a free layer 130 and/or the fixed layer 110 with perpendicular anisotropy can be provided by a multilayer comprised of alternating layers of magnetic material and material Y, where the layers of magnetic material are provided by combining ferromagnetic material (Ni, Fe, Co) with material X where X includes Cr, Ta, Nb, V, W, Hf, Ti, Zr, Pt, Pd and Y includes Cr, Pt, Pt, Pd, Ir, Rh, Ru, Os, Re, Au, Cu. Y can be thinner, equal, or thicker than the magnetic layers in thickness.

In a thirteenth implementation, a free layer 130 and/or fixed layer 110 with perpendicular anisotropy can be provided by a multilayer comprised of alternating layers of magnetic material and material Y, where the layers of magnetic material are provided by combining ferromagnetic material (Ni, Fe, Co) with material X where X includes at least one of B, C, N, O, Al, Si, P, S, Ga, Ge, In, Sn and Y includes Cr, Pt, Pt, Pd, Ir, Rh, Ru, Os, Re, Au, Cu. Y can be thinner, equal, or thicker than the magnetic layers in thickness.

In a fourteenth implementation, a free layer 130 and/or the fixed layer 110 with perpendicular anisotropy can be provided by a multilayer comprised of alternating layers of magnetic material and material Y, where the layers of magnetic material are provided by combining ferromagnetic material (Ni, Fe, Co) with material X where X includes Cr, Ta, Nb, V, W, Hf, Ti, Zr, Pt, Pd and Y includes at least one of B, C, N, O, Al, Si, P, S, Ga, Ge, In, Sn, an oxide, a nitride, or a transition metal silicide. Y can be thinner, equal, or thicker than the magnetic layers in thickness.

In a fifteenth implementations, the free layer and/or the fixed layer having perpendicular anisotropy could include material Mn, and/or including at least Ni, Al, Cr, Co, and/or Fe combined with nonmagnetic material(s). In certain implementations the nonmagnetic material(s) could include at least one of Ti, Zr, Hf; V, Nb, Ta, Cr, Mo, W, Pt, Pd, Ir, Rh, Ru, Os, Re, Au, Ag, Cu, B, C, N, O, Al, Si, P, S, Ga, Ge, In, Sn, Gd, Tb, Dy, Ho, Nd, an oxide, a nitride, or a transition metal silicide.

The above implementations can be applied to the fixed layer 110' and/or the free layer 130' in FIG. 2B.

Because the current required to switch a magnetic element by the spin transfer effect depends on the difference between the anisotropy field and the demagnetization field of the free magnetic layer, introducing perpendicular anisotropy can provide the benefit of lowering the spin transfer switching current. Moreover, the control of the composition of the magnetic elements in some implementations can modify the Curie temperature and magnetic moment of the magnetic material which can achieve the benefits of lower spin transfer switching current and increased thermal stability. Further, the control of the composition of the magnetic elements in some implementations can improve the film growth, which may lead to an improved overall performance of the magnetic elements and devices.

In perpendicular magnetic elements in FIG. 2A, the free layer 130 is in direct contact with the spacer layer 120. As such, the materials for the free layer 130 and the spacer layer 120 need to be matched in their lattice structures. This restriction can limit the materials suitable for forming such structures and thus the properties of the constructed magnetic elements. For example, some perpendicular MTJ devices based on the design in FIGS. 2A and 2B use materials that exhibit an undesired high damping constant, low STT efficiency and low TMR ratio. A Low TMR ratio, in turn, causes a undesired low read speed for STT-RAM chip and a low STT efficiency causes a undesired high STT switching current.

Implementations of perpendicular magnetic elements described below include a fixed layer having a magnetization fixed in a direction substantially perpendicular to the plane of the fixed layer, a nonmagnetic spacer layer over the fixed layer and a free layer. In addition, one or more additional layers are included between the spacer layer and the free layer and/or between the spacer layer and the fixed layer to engineer desired properties of the magnetic elements, e.g., increasing the spin transfer efficiency. Such one or more additional layers form an intermediary between the spacer layer and at least one of the free layer and the fixed layer to allow various magnetic materials to be used for either the free layer or the fixed layer to achieve desired properties of the magnetic element.

In some implementations, one or more interfacial layers can be provided to be in contact with the spacer layer. Such an interfacial layer is a thin layer of a magnetic material that exhibits a magnetization substantially perpendicular to the interfacial layer. This interfacial layer can be sufficiently thin, e.g., under or around 1 nm, to maintain its magnetization to be substantially perpendicular to the layers in the magnetic element via magnetic coupling with the free layer and the fixed layer.

Figure 3C:
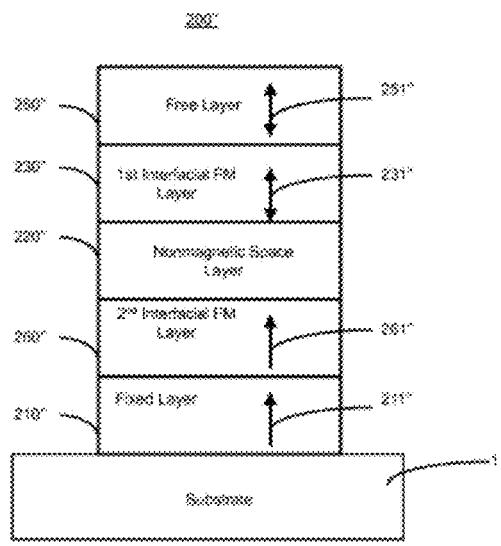

FIGS. 3A, 3B and 3C show three examples of magnetic elements with perpendicular magnetization having such additional layers. In the device 200 in FIG. 3A, the free layer is the magnetization layer 250 with a perpendicular magnetization 251 that can be switched between two perpendicular directions. The fixed layer is the magnetization layer 210 with a fixed substantially perpendicular magnetization 211. The non-magnetic spacer layer 220 is located between the free layer 250 and the fixed layer 210. An additional magnetization layer 230, an interfacial layer, is provided between the free layer 250 and the spacer layer 220 to provide an intermediary between the free layer 250 and the spacer layer 220 and has a substantially perpendicular magnetization 231 that is magnetically pinned to the magnetization 251 of the free layer 250 to switch with the free layer 250 based on the spin torque transfer. The thickness of the interfacial layer 230 is sufficiently thin, e.g., less than 1 nm, to allow the magnetization 231 to be strongly coupled to the magnetization 251 of the free layer 250. The presence of the interfacial layer 230 eliminates the direct contact and interface between the free layer 250 and the spacer layer 220 to allow selected magnetic materials to be used for the free layer 250.

FIG. 3B shows a different design using an interfacial magnetization layer. This device 200' includes a free layer 250' having a substantially perpendicular magnetization 251', a spacer layer 220', an interfacial layer 260' in contact with the spacer layer 220' and having a substantially perpendicular magnetization 261' and a fixed layer 210' with a fixed substantially perpendicular magnetization 211'. The interfacial layer 260' is located between the spacer layer 220' and the fixed layer 210' to eliminate the direct interfacing between the fixed layer 210' and the spacer layer 220'. The magnetization 261' of the interfacial layer 260' is magnetically coupled to and pinned to the fixed magnetization 211' of the fixed layer 210'.

FIG. 3C shows an example of a device that implements two interfacial layers on opposite sides of the spacer layer to separate both the free layer and the fixed layer from being in direct contact with the spacer layer. This device 200" includes a free layer 250" having a substantially perpendicular magnetization 251", a spacer layer 220", a first interfacial layer 230" in contact with the spacer layer 220" and having a substantially perpendicular magnetization 231", a fixed layer 210" with a fixed substantially perpendicular magnetization 211" and a second interfacial layer 260" with a substantially perpendicular magnetization 261". The first interfacial layer 230" is located between the spacer layer 220" and the free layer 250" to eliminate the direct interfacing between the free layer 250" and the spacer layer 220". The magnetization 231" of the first interfacial layer 231" is magnetically coupled to the free magnetization 251" of the free layer 250" to be switched along with the free layer 250". The second interfacial layer 260" is located between the spacer layer 220" and the fixed layer 210" to eliminate the direct interfacing between the fixed layer 210" and the spacer layer 220". The magnetization 261" of the second interfacial layer 260" is magnetically coupled to and pinned to the fixed magnetization 211" of the fixed layer 210".

In other implementations, one or more film stacks of two additional adjacent layers are included between the spacer layer and the free layer and/or between the spacer layer and the fixed layer to engineer desired properties of the magnetic elements. Of the two additional adjacent layers in one film stack, the first additional layer is an interfacial layer in contact with the spacer layer. This interfacial layer is a magnetic layer with a "native" magnetization which is either substantially perpendicular to the layer or, in absence of interaction with other layers, parallel to the interfacial layer and substantially perpendicular to the fixed layer magnetization. In the latter case, the magnetization of the interfacial layer becomes substantially perpendicular to the interfacial layer when it is magnetically coupled with other layers. The second additional layer is a connecting layer in contact with the interfacial layer on one side and in contact with either the free layer or the fixed layer on the other side to provide magnetic coupling between the interfacial layer with either the free layer or the fixed layer to ensure the magnetization of the interfacial layer to be substantially perpendicular to the interfacial layer. The connecting layer is a layer that is separate from the substantially perpendicular layer and the interfacial layer and is physically grown in between of the substantially perpendicular layer and the interfacial layer. The thickness of the interfacial layer can be made sufficiently large (e.g., greater than 2-20 Å to achieve a large TMR ratio).

Figure 4A:
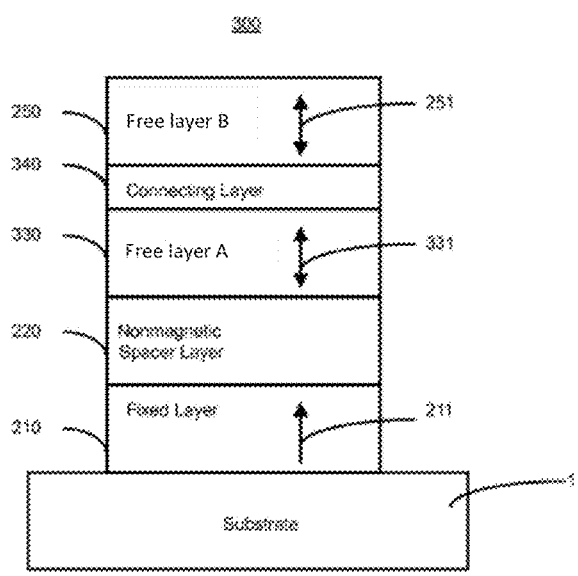
FIGS. 4A, 4B and 4C show two examples of magnetic elements having a perpendicular anisotropy based on interfacial and connecting layers.

FIG. 4A shows an example of a magnetic element 300 with substantially perpendicular magnetization having such additional layers. The free layer is the layer 250 with a substantially perpendicular magnetization 251 that can be switched between two perpendicular and opposite directions. The fixed layer is the layer 210 with a fixed perpendicular magnetization 211. The two additional layers are magnetic layers 330 and 340 located between the free layer 250 and the spacer layer 220. The magnetic layer 330 is an interfacial layer with a sufficiently thickness to provide a high magnetization 331 and the magnetic layer 340 is a connecting layer that is in contact with the free layer 250 and the interfacial layer 330 to magnetically pull the magnetization of the interfacial layer 330 to be perpendicular to the interfacial layer 330.

The interfacial layer 330 in this example has its magnetization 331 in the plane of the interfacial layer 330 when the layer 330 is free standing and is not magnetically coupled with other layers. The connecting layer 340 has a structure to provide magnetic coupling between the free layer 250 and the interfacial layer 330 to ensure that the magnetization of the interfacial layer 330 be perpendicular to the interfacial layer 330. For example, the connecting layer 340 can be made sufficiently thin to effectuate magnetic coupling that drives the magnetization of the interfacial magnetic layer from the its original in-plane direction to the final direction perpendicular to the plane. The perpendicular magnetization of the interfacial layer 330 strengthens the overall perpendicular anisotropy of the magnetic element and thus stabilizes the free layer 250 against thermal and magnetic perturbations. The connecting layer 340 can be selected to reduce the damping of either or both of the high magnetization interfacial layer 330 and the free layer 250.

In addition, the connecting layer 340 provides a structural separation or buffer between the free layer 250 and the interfacial layer 330 to permit that the free layer 250 and the interfacial layer 330 have different material structures. This function of the connecting layer 340 provides flexibility in selecting materials for the free layer 250 and other layers to optimize enhance the properties of the final magnetic element 300. The connecting layer 340 can prevent the crystalline properties of the free layer 250 from affecting the crystallinity of the tunneling junction barrier formed by the spacer layer 220 when made of an insulating material. The present design eliminates the direct contact between the substantially perpendicular free layer 250 and the barrier layer 220 to avoid correlation of the crystal properties of the free layer 250 and the barrier layer 220. Therefore, different crystal properties (such as lattice type) of the layers 250 and 220 can be designed to enhance the spin-torque efficiency and TMR without being limited to restrictions imposed by the compatibility of the layers 250 and 220. As an example, an epitaxial MgO (001) structure can be used as a high-quality tunneling junction barrier to improve the TMR ratio in STT device. The connecting layer 340 can also facilitate inducing the desired perpendicular anisotropy in the high-polarization interfacial layer 330, and thus assisting the substantially perpendicular free layer 250 to pull the magnetization of the high polarization interfacial layer 330 from the in-plane direction to the substantially perpendicular direction.

The connecting layer 340 can be made from various materials. Some examples include crystalline materials that include MgO with a resistance-area product lower than that of the spacer layer 220, such as MgO/Mn, MgO/Cr, MgO/V, MgO/Ta, MgO/Pd, MgO/Pt, MgO/Ru, and MgO/Cu. Amorphous materials may also be used to form the connecting layer 340, such as oxides SiOx, AlOx, and TiOx. Nitride materials can also be applied to form the connecting layer 340, such as TiN, TaN, CuN, SiNx. The connecting layer 340 can also be formed by a crystalline match material such as Mn, Cr, W, Mo, V, Ru, Cu, Pt, Pd, Au, and Ta.

The interfacial magnetic layer 330 can be configured to exhibit high spin polarization and a low damping. As an example, when the spacer layer 220 is MgO, the material for the interfacial layer 330 can be selected to create a high TMR ratio. As deposited, this interfacial layer 330 has an in-plane anisotropy and its anisotropy becomes substantially perpendicular to the layer when the multilayer structure is formed. For example, the interfacial layer 330 can include Fe, FeCo, CoFeB and a material with a high magnetization and crystallinity match with MgO.

Figure 4B:
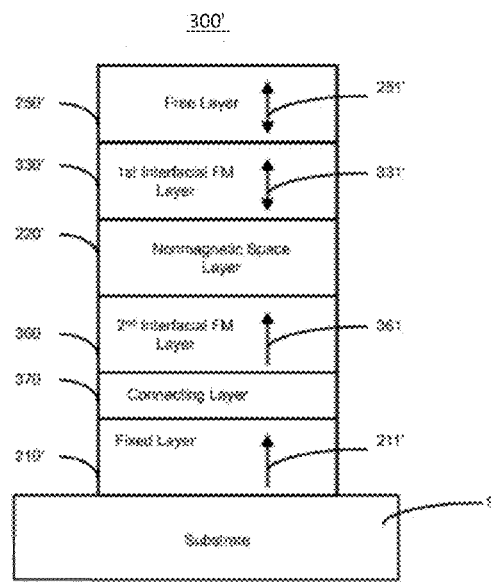

FIG. 4B shows an example of a magnetic element 300' having interfacial layers on both sides of the spacer layer. This device 300' includes a free layer 250' having a substantially perpendicular magnetization 251', a spacer layer 220', a first interfacial layer 330' between the spacer layer 220' and the free layer 250' and having a substantially perpendicular magnetization 331', a fixed layer 210' with a fixed substantially perpendicular magnetization 211', a second interfacial layer 360 in contact with the spacer layer 220', and a connecting layer 370 between the second interfacial layer 360 and the fixed layer 210'. The 1st interfacial layer 330' is located between the spacer layer 220' and the free layer 250' to eliminate the direct interfacing between the free layer 250' and the spacer layer 220'. The magnetization 331' of the interfacial layer 330' is magnetically coupled to the free magnetization 251' of the free layer 250' to switch with the free layer 250'. The connecting layer 370 magnetically couples the magnetization 361 of the interfacial layer 360 to the fixed layer 210' and thus fixes the magnetization 361. The second interfacial layer 360 and the connecting layer 370 are located between the spacer layer 220' and the fixed layer 210' to eliminate the direct interfacing between the fixed layer 210' and the spacer layer 220'.

Figure 4C:
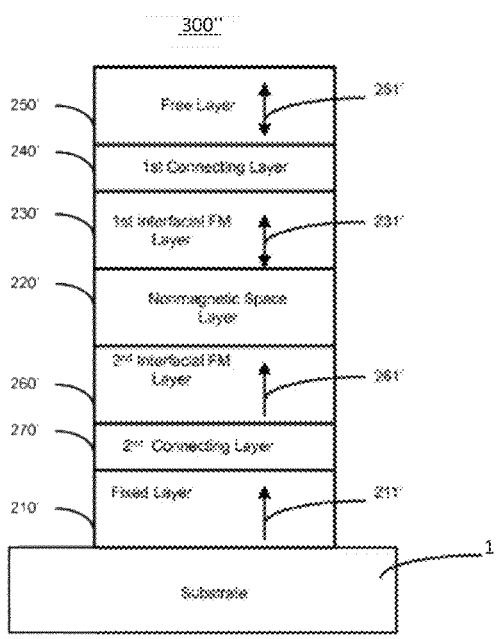

FIG. 4C shows another example of a magnetic element 300" that, in addition to having a connecting layer and an interfacial layer between the free layer and the spacer layer, implements a second connecting layer and a second interfacial layer between the fixed layer and the spacer layer. As illustrated, the magnetic element 300" includes a free layer 250' with a substantially perpendicular magnetization 251', a nonmagnetic spacer layer 220' and a fixed layer 210' with a substantially perpendicular magnetization 211'. Similar to the design in FIG. 4A, between the free layer 250' and the spacer layer 220', a first interfacial layer 230' and a first connecting layer 240' are formed. Between the fixed layer 210' and the spacer layer 220', a second interfacial layer 260' with a high polarization and a second connecting layer 270' with a resistance-area product lower than that of the spacer layer 220' for providing coupling between the second interfacial layer 260' and the fixed layer 210' are formed.

Interfacial layer and/or the connecting layer in the fixed layer and/or the free layer described above can also be applied to MTJ structures with the fixed layer above the spacer.

Figure 5:
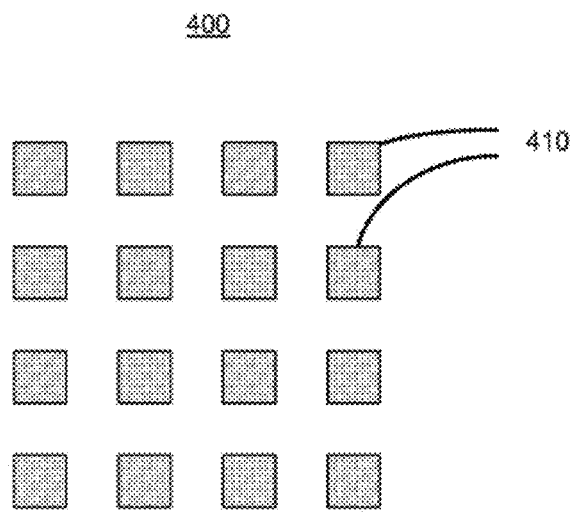
FIG. 5 depicts an example of a device of an array of magnetic elements each having a perpendicular anisotropy based on interfacial and connecting layers.

FIG. 5 shows an exemplary device 400 having an array of magnetic elements having at least one free layer having a perpendicular anisotropy. The device 400 includes an array of magnetic elements 410 that are formed on a substrate. Each magnetic element 410 can be configured to have a perpendicular anisotropy based on the designs in FIGS. 3A, 3B, 3C, 4A, 4B, and 4C described above. The device 400 also includes circuitry with isolation transistors, read and write lines, and logic circuitry for accessing individual magnetic elements 410. The device 400 can be used in magnetic memory systems.

Figure 6:
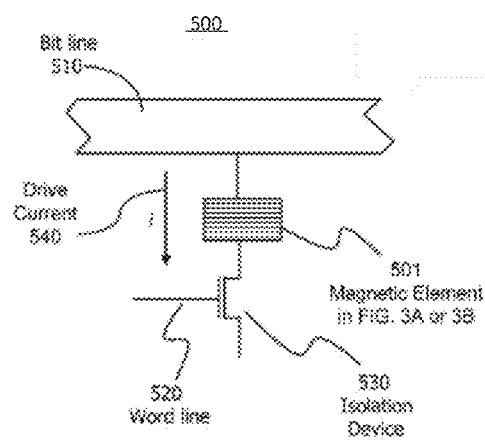
FIG. 6 depicts an example of a magnetic element having a perpendicular anisotropy free layer and/or fixed layer connected to a bit line and an isolation device.

The above magnetic element designs can be implemented for switching of the free layer based on the spin torque transfer. FIGS. 6 and 7 describe circuitry for switching based on the spin torque transfer.

FIG. 6 illustrates a part of an exemplary magnetic device 500 that includes an array of unit cells. Each unit cell includes a magnetic element 501 based on the spin-transfer torque effect. A conductor line 510 labeled as "bit line" is electrically coupled to the magnetic element 501 by connecting to one end of the magnetic element 501 to supply an electrical drive current 540 through the layers of the magnetic element 501 to effectuate the spin-transfer torque effect in the magnetic element 501. An electronic isolation device 530, such as an isolation transistor, is connected to one side of the magnetic element 501 to control the current 540 in response to a control signal applied to the gate of the transistor 530. A second conductor line 520 labeled as "word line" is electrically connected to the gate of the transistor 530 to supply that control signal. In operation, the drive current 540 flows across the layers in the magnetic element 501 to change magnetization direction of the free layer when the current 540 is greater than a switching threshold which is determined by materials and layer structures of the magnetic element 501. The switching of the free layer in the magnetic element 501 is based on the spin-transfer torque caused by the drive current 540 alone without relying on a magnetic field produced by the lines 510 and 520 or other sources.

The magnetic element 501 based on the spin-transfer torque effect can be implemented in various configurations, such as an MTJ, a spin valve, a combination of an MTJ and a spin valve, a combination of two MTJs and other configurations. Each of the free and pinned layers can be a single magnetic layer or a composite structure of multiple layers magnetically coupled together.

FIG. 7 shows an exemplary circuit that operates an arrayed magnetic memory device based on spin-transfer torque switching. Each cell 610 is connected in series to a select transistor 620 which corresponds to the isolation device 530 in FIG. 6. As illustrated, a bit line selector 601, a source line selector 602 and a word line selector 603 are coupled to the cell array to control the operations of each cell.

Additional inventive concepts will now be described with reference to FIGS. 8 through 15 obtained through the ab-initio calculations. As with the earlier embodiments, the following inventive concepts are directed particularly to free layer structures in multilayer magnetic elements such as used in a single or dual MTJ structure for a perpendicular spin-transfer-torque (P-STT) structure. Additional applications are for hybrid free layer embodiments (i.e., having 2 sub-layers exchange coupled together), or for free layers having connecting layers arranged therein to attract an amorphization material. Other benefits may be achieved by using the inventive concepts to provide a PPMA material for in-plane structures to help reduce switching current, for instance.

Numerous materials have been disclosed for providing the free layer in a multilayer magnetic element. For instance, as discussed previously, a free layer with perpendicular anisotropy can be provided by a multilayer comprised of alternating layers of magnetic material and material Y, where the layers of magnetic material are provided by combining ferromagnetic material (Ni, Fe, Co) with material X, where X includes at least one of B, C, N, O, Al, Si, P, S, Ga, Ge, In, and/or Sn; and where Y includes at least one of Cr, Pt, Pt, Pd, Ir, Rh, Ru, Os, Re, Au, and/or Cu. In conventional multilayer magnetic structures, the layers of magnetic material in the free layer often comprise CoFeB, because the inclusion of B creates a good lattice structure match with the MgO layer. Unfortunately, however, the presence of B in the free layer decreases Perpendicular Magnetic Anisotropy (PMA) levels, particularly when the Boron gets too close to the MgO interface. And because B has its lowest energy state (and is therefore most stable) when it is next to the MgO layer, B used in the free layer structure tends to migrate to the MgO interface where it interferes with the Fe—O hybridization and thus strongly decreases the PMA.

Figures 9A, 9B:
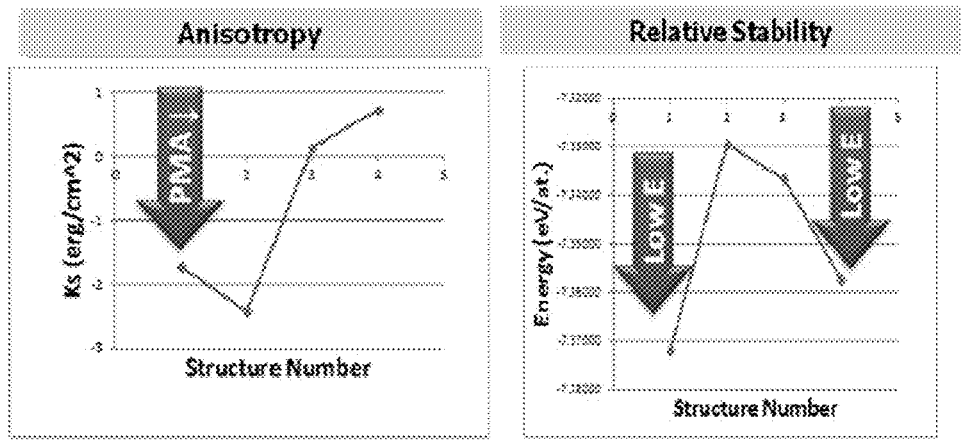
FIGS. 9a and 9b are graphs respectively illustrating the anisotropy and relative stability of each of the four different structures shown in FIG. 8.

The presence of interstitial Boron (B) in the free layer structure decreases PMA relative to the use of pure Iron (Fe). FIGS. 8 and 9a and 9b illustrate the effects of having interstitial B in the Fe of the free layer. Referring first to FIG. 8, four structures are shown in which interstitial B is present at various locations in the free layer structure. In structure 1, the Boron is located at the MgO interface, and in Structures 2 through 4, the Boron is arranged sequentially further away from the MgO interface and closer to the bulk (or center) of the free layer or free layer connecting layer. The two graphs provided in FIGS. 9a and 9b illustrate the Anisotropy and Relative Stability of the various structures.

As can be seen from FIGS. 9a and 9b, structure 1 (in which the Boron is at the MgO interface) has the lowest energy level and therefore the highest relative stability of the four structures. Unfortunately, however, maximum anisotropy is achieved when the Boron atoms are arranged in the middle of the free layer, farthest away from the MgO interface, as in structure 4. Structure 1, having the Boron atoms arranged near the MgO boundary, provides maximum stability but also results in strong in-plane (negative) anisotropy. As can further be seen, structures 2 and 3 are unstable, with structure 2 having poor anisotropy (strong negative anisotropy), and structure 3 having only slightly positive anisotropy.

In structure 4, however, with the B atoms arranged near the center of the free layer, good, positive anisotropy can be obtained. In addition, the Boron segregation profile indicates an approximately 30 meV energy barrier between positions near the MgO interface (structure 1) and positions in the middle of the free layer (structure 4). This energy barrier, together with a kinetic barrier, may allow the B atoms to stay at the middle of the free layer and thereby preserve PMA. In such configurations, where the B atoms are located near the center of the free layer, it may therefore be possible to use B atoms in the free layer structure and still maintain good PMA.

One solution is to introduce Tantalum (Ta) or another suitable material (e.g., W, Mn, Nb, Cr, V, Ru, Cu, Pt, Pd, Au) connecting into the free layer structure, such as through an connecting layer arranged near the center of the free layer. The use of a connecting layer, such as one including Ta, can attract the B away from the MgO interface and therefore improve PMA levels.

According to principles of the present inventive concepts, replacing B (either in whole or in part) with one or more different amorphization agents can result in a stable free layer structure with increased PMA. Preferred substitute amorphization agents preferably have one or more of the following attributes, for example: (1) they do not segregate to the MgO interface, and instead segregate in the bulk/center of the free layer or connecting layer inside the free layer; or (2) even if segregated to the MgO interface, they do not cause a strong reduction or reversal of PMA. Some materials that have been identified as having these attributes and therefore serving as promising alternatives to B include, for instance, Germanium (Ge), Lithium (Li), Berillium (Be), Hydrogen (H), Nitrogen (N) and Flourine (F) gases. The use of Ge, in particular, is expected to maintain PMA, even if it is segregated next to the MgO interface.

Figure 10:
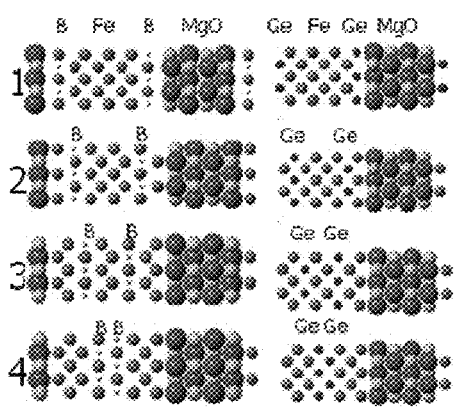
FIG. 10 is a schematic diagram comparing the atomic structures of the free layers of FIG. 8 with atomic structures of free layers containing Germanium (Ge) according to one embodiment of the present inventive concepts.

FIGS. 10, 11a, 11b, 11c, and 12 help illustrate the benefits of substituting Ge for B in the free layer structure of an STT device. FIG. 10 is a schematic atomic diagram comparing the four structures illustrated in FIG. 8 with similar structures including Ge rather than B. FIGS. 11a, 11b, and 11c provide charts comparing the anisotropy, stability, and concentrations of B and Ge in the four free layer structures 1, 2, 3, and 4 of FIG. 10. FIG. 12 summarizes the improved anisotropy characteristics of the Ge structures as compared to the B structures at various temperatures.

Referring now to FIGS. 10, 11a, 11b, 11c, and 12, the characteristics of B and Ge will be compared for use in the free layer structure. As can be seen in FIG. 11b, the segregation profiles of B and Ge are similar, with a strong tendency toward the MgO interface. Therefore both B and Ge are in their most stable state when they are arranged closest to the MgO boundary. However, as shown in FIG. 11a, Ge atoms arranged close to the MgO interface do not diminish Ks (and hence PMA) as much as the presence of B atoms near the MgO interface do. As further shown in FIG. 12, using Ge in the free layer can result in a positive PMA at various temperatures, as opposed to the negative PMA from the interstitial B atoms. Accordingly, Ge provides a strong candidate for replacing B in the free layer structure because even if it is arranged at the MgO interface it does not significantly impair the PMA of the free layer.

Studies that have been performed on CoFeGe structures used in other technologies (i.e., spin-valve structures) have shown additional benefits to using this composition, including, for example, a controllable Ms, high MR, and very low damping.

Figure 13:
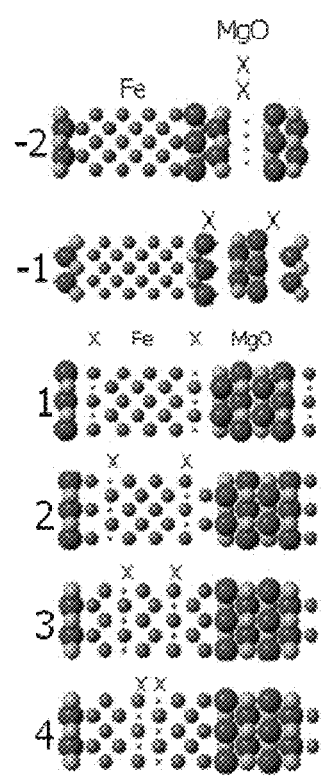
FIG. 13 is a schematic diagram illustrating the atomic structures of six different free layer structures having an amorphization agent X.
Figure 14A:
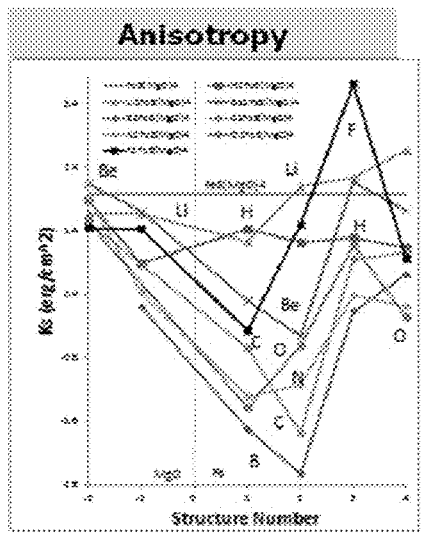
FIGS. 14a, 14b, and 14c are graphs comparing the anisotropy, relative stability, and layer concentrations, respectively, for different amorphization agents X arranged according to each of the six different structures of FIG. 13.
Figure 14B:
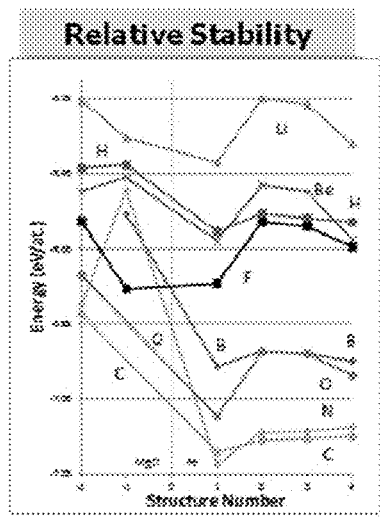
Figure 14C:
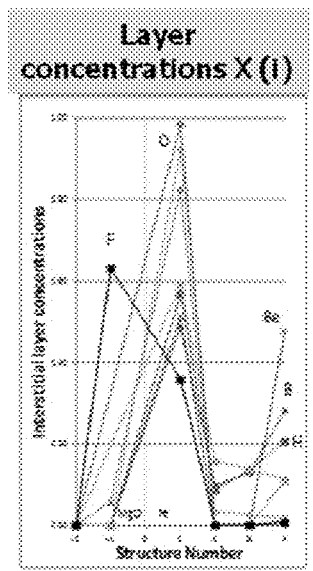
Figure 15:
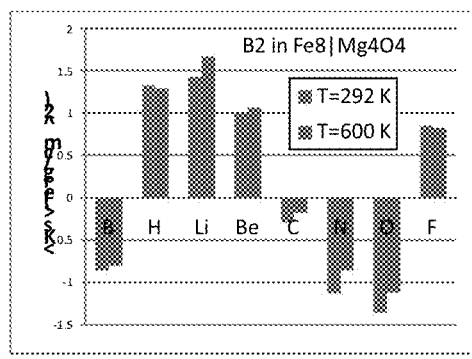
FIG. 15 is a graph comparing the anisotropy of the different amorphization agents X at two different temperatures.

FIGS. 13, 14a, 14b, 14c, and 15 illustrate anisotropy, stability, and concentration characteristics with respect to other potential free layer amorphization agents, including, for example, Li, Be, H and F. In FIGS. 14a, 14b, and 14c, the anisotropy, relative stability, and concentrations of these various materials are compared for the various structures −2, −1, 1, 2, 3, and 4 of FIG. 13. In FIG. 13, structures −2 and −1 illustrate cases where the amorphization material X is arranged within the MgO layer, either in the center (structure −2) or at the interfaces (structure −1). Structures 1 through 4 are similar to the previous structures 1 through 4, shown in FIGS. 8 and 10, with respect to the location of the amorphization material in the free layer.

Referring to FIGS. 13, 14a, 14b, 14c, and 15, as can be seen from these charts and graphs, use of any one or more of the materials Li, Be, H, and F as an amorphization agent can result in positive PMA values with a relatively stable structure. Each of these materials therefore has promise as a potential substitute amorphization agent for replacing B, either in whole or in part, in the free layer structure according to the present inventive concepts.

According to one particular aspect of the inventive concepts, therefore, a material composition for forming a free layer in a STT structure can comprise: $Co_xFe_yM_z$, where M is a non-magnetic material selected from the group consisting of: Ge, Bi, Li, Be, F, N, and H. The non-magnetic material M preferably has properties that assist in forming a good crystalline orientation and matching with MgO (e.g., the material M preferably acts as an amorphization material that is amorphous as deposited and crystalline after annealing). The material M also preferably either does not segregate to the MgO interface or, if it does segregate to the MgO interface, it does not significantly impair hybridization of Fe and O and therefore does not significantly reduce PMA.

According to another aspect of the inventive concepts, a material composition for forming a free layer in a STT structure can comprise: $MgO/Co_xFe_yM_z$ (connecting layer) $Co_xFe_yM_z/MgO$, where M is attracted to the connecting layer during annealing. The connecting layer can, for instance, include Tantalum (Ta). By providing an connecting layer to attract the material M, this can prevent M from migrating toward the MgO interface and therefore preserve the PMA.

According to still another aspect of the inventive concepts, a material for forming a free layer in an STT structure can comprise: a graded composition of $Co_xFe_yM_z$, where z changes within the free layer. For instance, the greatest concentration of M (i.e., increased z) can be arranged near the center of the free layer and can decrease towards the MgO interface. This can be achieved, for instance, using co-sputtering or other suitable technique. For gases such as H and F, a reactive sputtering technique could be used, for example.

Figure 16:
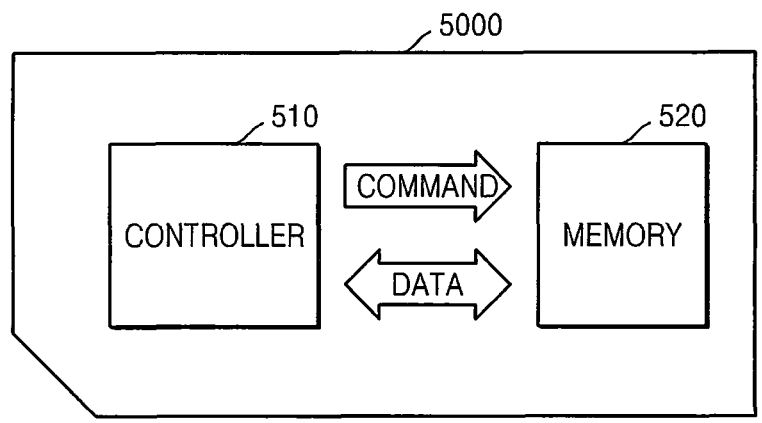
FIG. 16 is a block diagram showing a memory card according to an embodiment of the inventive concept.

FIG. 16 is a block diagram showing a memory card 5000 according to an embodiment of the inventive concept.

Referring to FIG. 16, a controller 510 and a memory 520 may be arranged in the memory card 5000 to exchange electric signals. For example, when the controller 510 issues a command, the memory 520 may transmit data. The memory 520 may include a magnetic device according to any one of the above-described exemplary embodiments. A magnetic device according to various exemplary embodiments of the present inventive concept may be arranged in an architecture memory array (not shown) having a variety of shapes corresponding to a corresponding logic gate design that is well known to a technical field to which the present inventive concept pertains to. A memory array in which a plurality of rows and columns are arranged may form one or more memory array bank (not shown). The memory 520 may include a memory array (not shown) or a memory array bank (not shown). Also, the memory card 5000 may further include a typical row decoder (not shown), a column decoder (not shown), I/O buffers (not shown), and/or a control register (not shown) to drive the above-described memory array bank (not shown). The memory card 5000 may be used for a variety of memory cards such as memory stick cards, smart media (SM) cards, secure digital (SD) cards, or multimedia cards (MMC).

Figure 17:
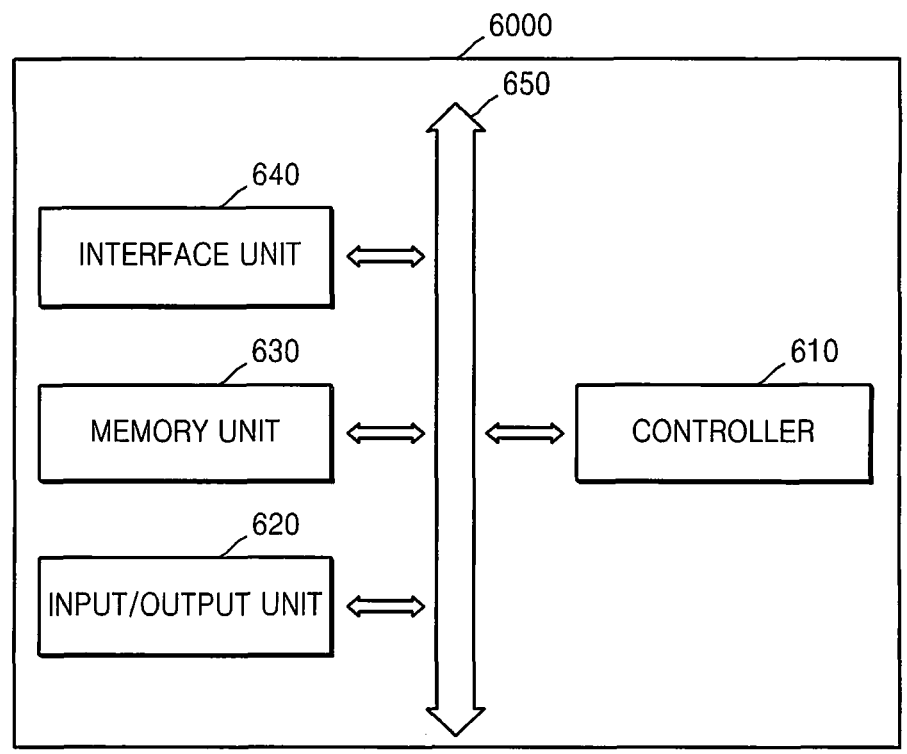
FIG. 17 is a block diagram showing a system according to an embodiment of the inventive concept.

FIG. 17 is a block diagram showing a system 6000 according to an embodiment of the inventive concept.

Referring to FIG. 17, the system 6000 may include a controller 610, an input/output (I/O) unit 620, a memory unit 630, and an interface unit 640. The system 6000 may be a mobile system or a system for transmitting or receiving information. The mobile system may be a PDA, a portable computer, a web tablet, a wireless phone, a mobile phone, a smart phone, a digital music player, or a memory card. The controller 610 may execute a program and control the system 6000. The controller 610 may be, for example, a microprocessor, a digital signal processor, a microcontroller, or a device similar thereto. The I/O unit 620 may be used to input or output data of the system 6000. The system 6000 may exchange data with an external apparatus such as a personal computer or a network by being connected to the external apparatus using the I/O unit 620. The I/O unit 620 may be, for example, a keypad, a keyboard, or a display. The memory 630 may store codes and/or data for the operation of the controller 610 and/or store data processed by the controller 610. The memory 630 may include a magnetic memory device or memory element according to any one of the above-described exemplary embodiments. The interface unit 640 may be a data transmission path between the system 6000 and an external apparatus. The controller 610, the I/O unit 620, the memory unit 630, and the interface unit 640 may communicate with one another through a bus 650. For example, the system 6000 may be used for mobile phones, MP3 players, navigations, portable multimedia players (PMPs), solid state disks (SSDs), or household appliances.

Throughout the specification, features shown in one embodiment may be incorporated in other embodiments within the spirit and scope of the inventive concept.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

While this document contains many specifics, these should not be construed as limitations on the scope of any invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and may even initially be claimed as such, one or more features from a claimed combination can in some cases be excised from the combination, and the claimed combination may be directed to a subcombination or a variation of a subcombination.

It should also be noted that although the drawings may, in some instances, show distinct magnetizations for interfacial layers arranged adjacent to magnetic layers, when there is an interfacial layer adjacent to a magnetic layer, the two may be strongly coupled and would behave as a single switching element. In addition, when a magnetic layer (either fixed or free) is implemented with an interfacial layer, that interfacial layer may effectively become part of the fixed or free layer it is adjacent to, and can therefore be thought of as a two-part free or fixed layer (e.g., "free layer part A+free layer part B" or "fixed layer part A+fixed layer part B") as opposed to a free/fixed layer plus a separate interfacial layer.

In addition, although only a few implementations are disclosed herein, variations and enhancements with respect to the described implementations can be made, and other implementations will be understood by those skilled in the art, based on what is described and illustrated in this document. Accordingly, the inventive concepts should not be construed as being limited to the specific embodiments disclosed herein.

The invention claimed is:

1. A material composition for forming a free layer of a magnetic device, said material composition comprising:
   $Co_xFe_yM_z$, wherein M is a non-magnetic amorphization agent material selected from the group consisting of: Bi, Li, Be, F, N, and H, to cause a crystalline orientation of the free layer to closely match with an MgO interface of the magnetic device, and
   wherein the composition comprises a graded composition in which the concentration z of the non-magnetic material M gradually changes within the free layer.

2. A material composition according to claim 1, wherein the material M does not segregate to the MgO interface of the magnetic device during annealing.

3. A material composition according to claim 1, wherein the free layer has a Perpendicular Magnetic Anisotropy (PMA) and wherein the material M does not significantly impair hybridization of Fe and O and therefore does not significantly impair the PMA of the free layer following annealing.

4. A material composition according to claim 1, wherein the magnetic device comprises a single MTJ structure.

5. A material composition according to claim 1, wherein the magnetic device comprises a dual MTJ structure.

6. A material composition according to claim 1, wherein the free layer comprises a hybrid free layer having two or more sublayers exchange coupled to each other.

7. A material composition according to claim 1, wherein the concentration z is highest towards the center of the free layer and lower towards the MgO interface.

8. A material composition according to claim 1, wherein the free layer is a single-layer structure.

9. A material composition according to claim 1, wherein the free layer further comprises a connecting layer, said connecting layer being arranged near the center of the free layer and configured to attract the non-magnetic material M away from the MgO interface.

10. A material composition according to claim 9, wherein the connecting layer comprises Ta.

11. A free layer in a STT structure having an MgO interface arranged next to the free layer, said free layer comprising:
    a material composition comprising $Co_xFe_yM_z$, wherein M is a non-magnetic amorphization agent material selected from the group consisting of: Bi, Li, Be, F, N, and H, to cause a crystalline orientation of the free layer to substantially match with the MgO interface; and
    a connecting layer arranged within the $Co_xFe_yM_z$ material composition,
    wherein M is attracted to the connecting layer during annealing, and
    wherein the material composition comprises a graded composition of $Co_xFe_yM_z$, where z gradually changes within the free layer.

12. A free layer according to claim 11, wherein the connecting layer comprises Ta.

13. A free layer according to claim 11, wherein the connecting layer is arranged near a center of the free layer.

14. A free layer according to claim 11, wherein the non-magnetic material M does not segregate to the MgO interface.

15. A magnetic element, comprising:
    a fixed layer having a fixed layer magnetization fixed in a direction substantially perpendicular to the fixed layer;
    a free layer extending in a direction that is parallel with the fixed layer and has a free layer magnetization that is substantially perpendicular to the free layer and has a direction that is changeable relative to the fixed layer magnetization; and
    an MgO layer providing an MgO interface between the MgO layer and the free layer,
    wherein the free layer comprises:
        $Co_xFe_yM_z$, wherein M is a non-magnetic amorphization agent material selected from the group consisting of: Bi, Li, Be, F, N, and H, to cause a crystalline orientation of the free layer to substantially match with the MgO interface, and
        wherein the material composition comprises a graded composition in which the concentration z of the non-magnetic material M gradually changes within the free layer.

16. A magnetic element according to claim 15, wherein the material M does not segregate to the MgO interface of the magnetic element during annealing.

17. A magnetic element according to claim 15, wherein the magnetic element comprises a single MTJ structure.

18. A magnetic element according to claim 15, wherein the magnetic element comprises a dual MTJ structure.

19. A magnetic element according to claim 15, wherein the free layer comprises a hybrid free layer having two or more sublayers exchange coupled to each other.

20. A magnetic element according to claim 15, wherein the concentration z of the non-magnetic material M is highest towards the center of the free layer and gradually decreases towards the MgO interface.

21. A magnetic element according to claim 15, wherein the free layer is a single-layer structure.

22. A magnetic element according to claim 15, wherein the free layer further comprises a connecting layer, said connecting layer being arranged near the center of the free layer and configured to attract the non-magnetic material M away from the MgO interface.

* * * * *